(12) United States Patent
Lim (10) Patent No.: US 9,514,793 B2
(45) Date of Patent: Dec. 6, 2016

(54) SEMICONDUCTOR MEMORY DEVICE AND OPERATING METHOD THEREOF

(71) Applicant: SK hynix Inc., Gyeonggi-do (KR)

(72) Inventor: Sang-Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/731,146

(22) Filed: Jun. 4, 2015

(65) Prior Publication Data

US 2016/0172012 A1    Jun. 16, 2016

(30) Foreign Application Priority Data

Dec. 11, 2014    (KR) .......................... 10-2014-0178292

(51) Int. Cl.
*G11C 7/10* (2006.01)
*G11C 7/20* (2006.01)
*G11C 11/56* (2006.01)

(52) U.S. Cl.
CPC ................. *G11C 7/20* (2013.01); *G11C 7/106* (2013.01); *G11C 7/1048* (2013.01); *G11C 11/56* (2013.01); *G11C 2207/005* (2013.01)

(58) Field of Classification Search
CPC ..... G11C 16/26; G11C 16/0466; G11C 29/52; G11C 7/1057; G11C 7/20

USPC ............ 365/185.03, 185.05, 185.07, 185.09, 365/185.11, 185.17, 185.18, 185.23, 154, 365/156, 189.011, 189.14, 189.05
See application file for complete search history.

(56) References Cited

U.S. PATENT DOCUMENTS

2015/0332777 A1*  11/2015  Yoon ...................... G11C 16/26
                                                                          714/764

FOREIGN PATENT DOCUMENTS

| KR | 1020090000378 |   | 1/2009 |
|----|---------------|---|--------|
| KR | 1020140057304 | * | 5/2014 |

* cited by examiner

*Primary Examiner* — Fernando Hidalgo
(74) *Attorney, Agent, or Firm* — IP & T Group LLP (57) ABSTRACT

A semiconductor memory device includes a plurality of data buffering units corresponding to a data line, wherein the data buffering units include a first data buffering unit suitable for latching data stored in a memory cell in a data read operation, and second data buffering units, an output unit suitable for outputting the data latched in the first data buffering unit, and a control block suitable for controlling a current path to be formed between the second data buffering units and the output unit in the data read operation.

20 Claims, 8 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2014-0178292, filed on Dec. 11, 2014, which is incorporated herein by reference in its entirety.

BACKGROUND

1. Field

Exemplary embodiments of the present invention relate to a semiconductor design technology and, more particularly, to a semiconductor memory device including a page buffer circuit.

2. Description of the Related Art

In general, semiconductor memory devices are classified into volatile memory devices, such as dynamic random access memory (DRAM) and static random access memory (SRAM), and nonvolatile memory devices, such as programmable read only memory (PROM), erasable PROM (EPROM), electrically EPROM (EEPROM), and flash memory. Unlikely volatile memory devices, nonvolatile memory devices retain data stored therein even without power, and thus nonvolatile memory devices do not require additional circuits for retaining stored data. For reference, volatile memory devices are superior to nonvolatile memory devices in terms of circuit size and access operation speed for a given storage capacity.

Flash memory devices, a representative nonvolatile memory device, stores data in memory cells through programming operations and erasing operations. Programming operations entail the accumulation of electrons in a floating gate of a transistor that forms a memory cell. In an erasing operation, electrons accumulated in the floating gate of the transistor are discharged to the substrate. Through such operations, flash memory devices store data corresponding to '1' or '0' in the memory cells. Furthermore, flash memory devices output stored data through sensing operations. A sensing operation detects the amount of negative charge (i.e. electrons) in the floating gate, and the flash memory device determines whether the stored data has a value of '1' or '0' using the sensing operation, and then outputs the stored data.

As described above, data ('0' or '1') is stored in a single memory cell. When one bit data is stored in one memory cell, the memory cell is called a single level cell (SLC). When multi-bit data is stored in a single memory cell, these memory cells are called multi-level cells (MLC). In a single level cell, one determination voltage is required to determine the data stored in a memory cell, and in a multi-level cell, at least three determination voltages are required to determine the data stored in a memory cell. For example, three determination voltages are required to determine data having values of '00', '01', '10', and '11'.

Figure 1:
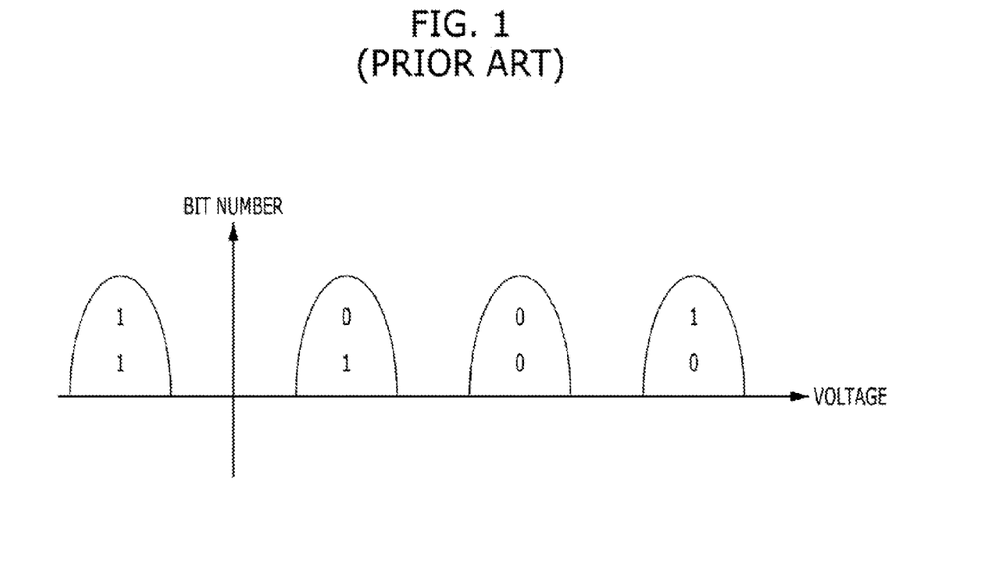
FIG. 1 is a diagram for explaining the threshold voltage distribution of memory cells of an MLC flash memory.

FIG. 1 is a diagram for explaining the threshold voltage distribution of memory cells of an MLC flash memory. Referring to FIG. 1, the threshold voltage distributions corresponding to a bi-level cell (BLC) scheme are formed through programming operations for storing data in the memory cells. Each of the threshold voltage distributions of the memory cells corresponds to data having values of '11', '01', '00', and '10'.

In programming a BLC memory cell, which is capable of storing 2 bit data, a lower bit (i.e., a least significant bit, LSB) is programmed and then an upper bit (i.e., a most significant bit, MSB) is programmed. In the programming operation, an incremental step pulse programming (ISPP) scheme, in which a program voltage increases step by step, is generally used.

SUMMARY

Various embodiments are directed to a semiconductor memory device capable of adjusting driving ability used for outputting data in a data read operation.

In an embodiment, a semiconductor memory device may include: a plurality of data buffering units corresponding to a data line, wherein the data buffering units include a first data buffering unit suitable for latching data stored in a memory cell in a data read operation, and second data buffering units; an output unit suitable for outputting the data latched in the first data buffering unit; and a control block suitable for controlling a current path to be formed between the second data buffering units and the output unit in the data read operation.

Each of the second data buffering units may include: a latching section suitable for latching data; a data transfer section coupled between a sensing node and the latching section; and a set/reset section coupled between the latching section and a common node.

The data transfer section may transfer data, transferred to the sensing node, to the latching section in a data duplication operation.

The set/reset section may include in each of the second data buffering units initializes the latching section at a beginning of a data duplication operation.

The control block may control the data transfer section or the set/reset section, which is included in each of the second data buffering units, based on the data stored in the first data buffering unit in the data read operation.

Each of the first data buffering unit and the second data buffering units may include: a latching section suitable for latching data; and a transfer section coupled between the latching section of the first data buffering unit and the latching sections of the second data buffering units.

Each of the second data buffering units may be coupled to the first data buffering unit through a corresponding transfer section.

In the data read operation, the control block selectively may activate the transfer sections of the second data buffering units.

In a programming operation, data may be stored in the second data buffering units.

In an embodiment, a method for operating a semiconductor memory device may include: sensing data stored in a memory cell and latching the sensed data in a first data buffering unit; duplicating the data latched in the first data buffering unit to second data buffering units; and outputting the data by using the first data buffering unit and at least one data buffering unit of the second data buffering units.

The duplicating may include: initializing the at least one data buffering unit of the second data buffering units; transferring the data latched in the first data buffering unit to a predetermined node; and latching the data transferred to the predetermined node in the at least one data buffering unit of the second data buffering units.

In the outputting of the data, the first data buffering unit and the at least one data buffering unit of the second data buffering units may have duplicate data.

In the outputting of the data, a current path may be formed between an output terminal and the first data buffering unit and the at least one data buffering unit of the second data buffering units.

The method may further include: latching data in the second data buffering units in a programming operation.

In an embodiment, a semiconductor memory system may include: a semiconductor memory device including a plurality of data buffering units; and a controller suitable for receiving information on the number of the data buffering units, and generating activation information corresponding to the number of data buffering units to be activated in a data read operation of the semiconductor memory device.

The data buffering units may include: a first data buffering unit suitable for latching data stored in the memory cell in a data read operation; and second data buffering units suitable for latching data in a programming operation, wherein the second data buffering units are selectively activated based on the activation information.

Each of the second data buffering units may include: a latching section suitable for latching data; a data transfer section coupled between a sensing node and the latching section; and a set/reset section coupled between the latching section and a common node.

In the data read operation, the data transfer section and the set/reset section may include in each of the second data buffering units are controlled based on the data latched in the first data buffering unit and the activation information.

Each of the second data buffering units may be coupled to the first data buffering unit through a corresponding transfer section.

In the data read operation, the transfer sections of the second data buffering units may be selectively activated based on the activation information.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
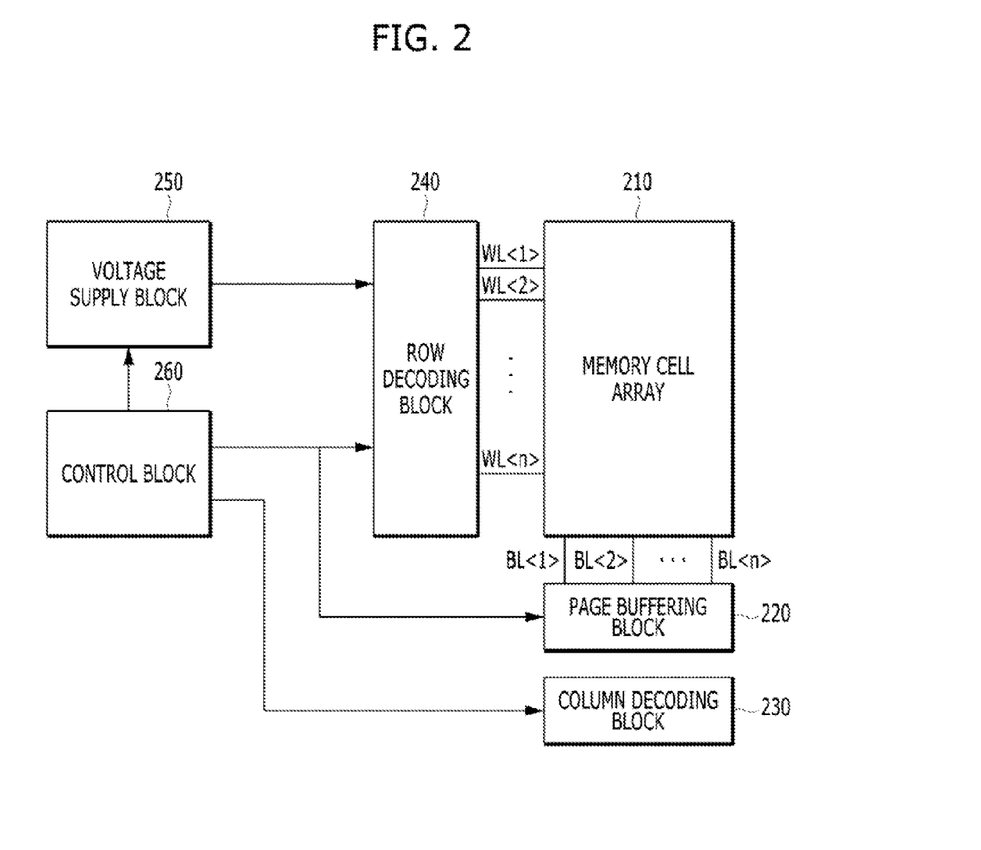
FIG. 2 is a block diagram illustrating a semiconductor memory device in accordance with an embodiment of the present invention.

FIG. 2 is a block diagram illustrating a semiconductor memory device in accordance with an embodiment of the present invention. For convenience, a flash memory device will be described as an example.

Referring to FIG. 2, the flash memory device may include a memory cell array 210, a page buffering block 220, a column decoding block 230, a row decoding block 240, a voltage supply block 250, and a control block 260.

The memory cell array 210 includes a plurality of multi-level cells that are coupled to a plurality of word lines WL<1:n> (n is a natural number). Although not illustrated in the drawing, the multi-level cells are coupled in a string form, and are coupled to a plurality of bit lines (i.e., data lines) BL<1:m> (m is a natural number), respectively.

The page buffering block 220 stores inputted data in a programming operation and stores outputted data in a data read operation. The page buffering block 220 may include a plurality of latch circuits for storing data.

The column decoding block 230 selects the bit lines BL<1:m> in response to an inputted address (not illustrated), and the row decoding block 240 selects the word lines WL<1:n> in response to the inputted address. The voltage supply block 250 supplies voltages used for the programming operation and the data read operation to the row decoding block 240. The voltages include a programming voltage of the aforementioned ISPP scheme, and the like.

The control block 260 controls the page buffering block 220, the column decoding block 230, the row decoding block 240, and the voltage supply block 250 in the programming operation and the data read operation. Particularly, the control block 260 controls current paths of the page buffering block 220.

The semiconductor memory device may control the current paths of the page buffering block 220 in the data read operation and adjust driving ability in the data read operation.

Figure 3:
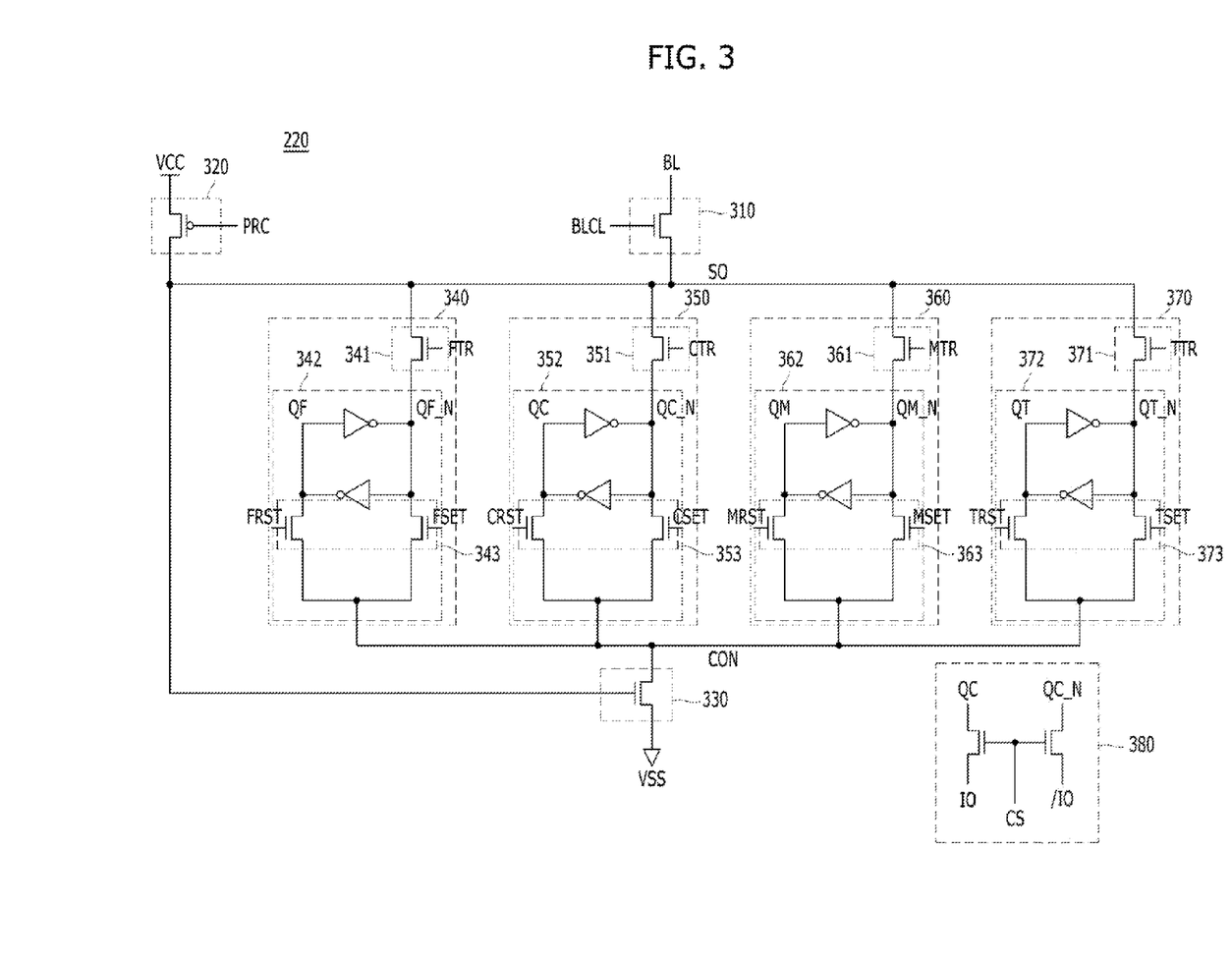
FIG. 3 is a detailed diagram of a page buffering block shown in FIG. 2.

FIG. 3 is a detailed diagram of the page buffering block 220 shown in FIG. 2. For the purpose of convenience, a page buffer corresponding to one bit line BL of the bit lines BL<1:m> will be described as an example. Furthermore, a method for coupling two pairs of bit lines to one page buffer and selectively using the bit lines to increase operation speed of the semiconductor memory device may be employed.

Referring to FIG. 3, the page buffering block 220 includes a bit line coupling unit 310, a pre-charging unit 320, a discharging unit 330, first to fourth data buffering units 340, 350, 360, and 370, and a data input/output unit 380.

The bit line coupling unit 310 couples the bit line BL to a sensing node SO in response to a bit line clamping voltage BLCL. The pre-charging unit 320 couples a power supply voltage VCC terminal to the sensing node SO in response to a pre-charging control signal PRC, and thus the sensing node SO is precharged to the power supply voltage VCC. The discharging unit 330 couples a common node CON to a ground voltage VSS terminal in response to the sensing node SO, and thus the common node CON is discharged to the ground voltage VSS.

The first to fourth data buffering units 340, 350, 360, and 370 store data in the programming operation. The data includes actual data stored in the multi-level cell, data corresponding to a programming state, and the like. Each of the first to fourth data buffering units 340, 350, 360, and 370 includes a data transfer section, a latching section, and a set/reset section. Hereinafter, for the purpose of convenience, the second data buffering unit 350 will be representatively described.

The second data buffering unit 350 includes a data transfer section 351 for coupling the sensing node SO to a latching section 352 and transferring data in response to a transfer control signal CTR, the latching section 352 for storing (i.e., latching) the data, and a set/reset section 353 for setting or resetting the latching section 352 in response to a reset signal CRST and a set signal CEST of the second data buffering unit 350.

The data input/output unit 380 respectively couples a node QC and a complementary node QC_N of the second data buffering unit 350 to an input/output line IO and a complementary input/output line /IO in response to an input/output control signal CS. This coupling operation is used when data inputted from the input/output line IO and the complementary input/output line /IO to the second data buffering unit 350 in the programming operation or transferring data stored in the second data buffering unit 350 to the input/output line IO and the complementary input/output line /IO in the data read operation.

Hereinafter, with reference to FIG. 3, a description of a conventional data read operation will be described. In the programming operation, all the first to fourth data buffering units 340, 350, 360, and 370 are used, and in the data read operation, the second data buffering unit 350 coupled to the data input/output unit 380 is used.

First, the sensing node SO is precharged to the power supply voltage VCC in response to the pre-charging control signal PRC. Then, when the bit line clamping voltage BLCL is activated, the voltage of the sensing node SO is determined according to data stored in the multi-level cell. Then, when the transfer control signal CTR corresponding to the second data buffering unit 350 is activated, data corresponding to the voltage of the sensing node SO is stored in the latching section 352 of the second data buffering unit 350. The data is stored in the second data buffering unit 350. For the purpose of convenience, operations until this point will be defined as a 'data sensing operation'. After the data sensing operation, when the node QC and the complementary node QC_N are coupled to the input/output line IO and the complementary input/output line /IO in response to the input/output control signal CS, data is outputted through the input/output line IO and the complementary input/output line /IO, so that the data read operation of the semiconductor memory device ends.

As seen from the data read operation, the page buffering block 220 outputs data to the input/output line IO and the complementary input/output line /IO by using the second data buffering unit 350 in the data read operation. Accordingly, as the driving ability of the second data buffering unit 350 is large, data is quickly outputted to the input/output line IO and the complementary input/output line /IO, and as the driving ability of the second data buffering unit 350 is small, data is slowly outputted to the input/output line IO and the complementary input/output line /IO. This means that the driving ability of the second data buffering unit 350 decides the operation speed (hereinafter, referred to as a 'data read operation speed') of the data read operation. However, since the first data buffering unit 340, the third data buffering unit 360, and the fourth data buffering unit 370 are arranged in an area where the second data buffering unit 350 is arranged, in addition to the second data buffering unit 350, the interval between circuits is very narrow. Therefore, it may be difficult to increase the size of transistors constituting the second data buffering unit 350 to increase the driving ability of the second data buffering unit 350. As a consequence, designing the driving ability of the second data buffering unit 350 to be large is not very effective.

The driving ability of the second data buffering unit 350 may be adjusted by controlling the data read operation through the control block 260 of FIG. 2.

A data duplication operation is an operation for duplicating (or copying) data stored in the second data buffering unit 350 to other second data buffering units, other than the second data buffering unit 350, through the data sensing operation. Accordingly, after the data duplication operation, the data stored in the second data buffering unit 350 are equal to data stored in the data buffering units subjected to the duplication operation.

Figure 4:
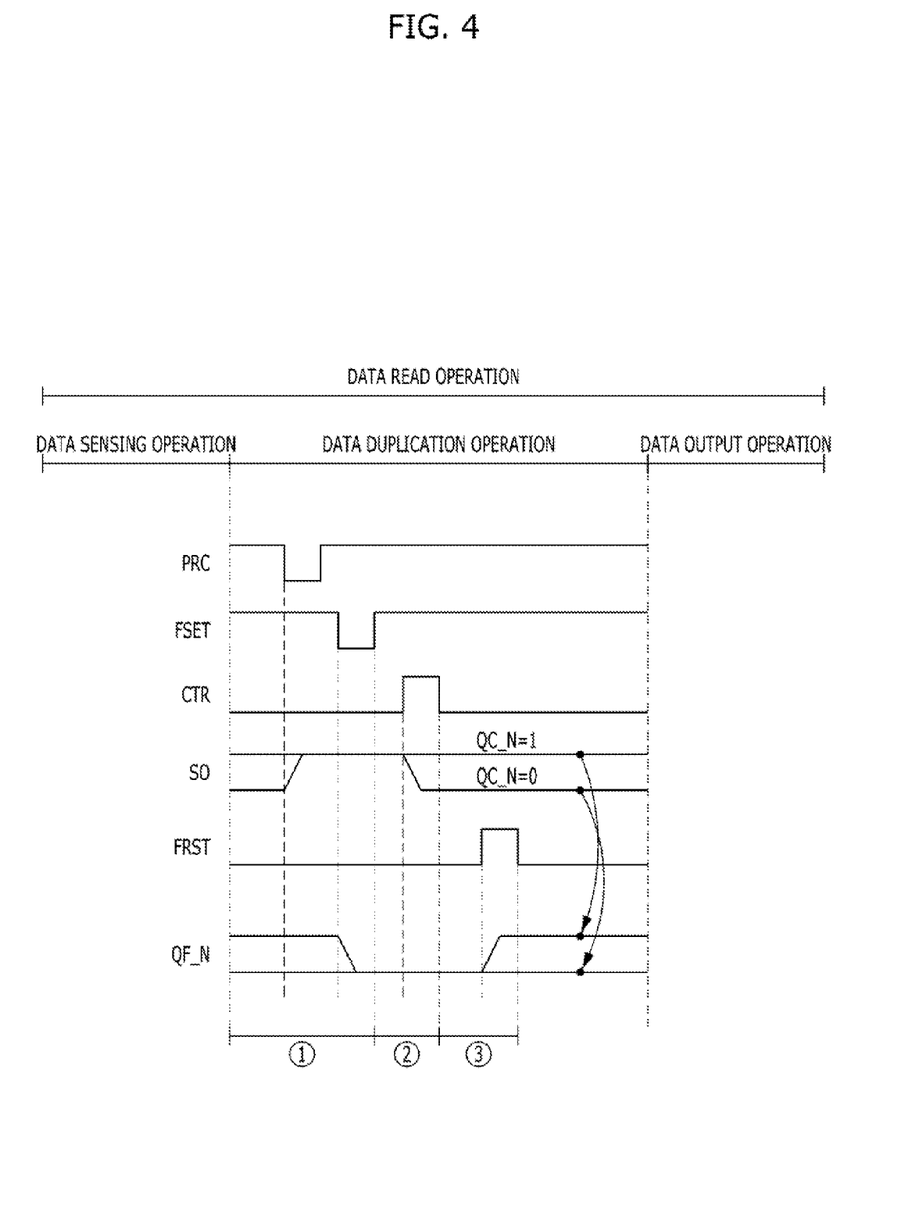
FIG. 4 is a timing diagram for explaining a data duplication operation of the page buffering block shown in FIG. 3.

FIG. 4 is a timing diagram for explaining the data duplication operation of the page buffering block 220 shown in FIG. 3. For the purpose of convenience, it is assumed that data stored in the second data buffering unit 350 are duplicated to the first data buffering unit 340.

FIG. 4 illustrates the pre-charging control signal PRC, a set signal FSET of the first data buffering unit 340, the transfer control signal CTR of the second data buffering unit 350, the sensing node SO, a reset signal FRST of the first data buffering unit 340, and a node 'QF_N' of the first data buffering unit 340. Since the data duplication operation is performed after the data sensing operation, the bit line clamping voltage BLCL used in the data sensing operation has been deactivated and predetermined data has been already stored in the second data buffering unit 350 through the data sensing operation. That is, the node 'QC_N' of the second data buffering unit 350 stores data having a value of logic 'high' (1) or logic 'low' (0) by the data sensing operation.

Referring to FIGS. 3 and 4, after the data sensing operation, when the pre-charging control signal PRC is activated to logic 'low' to initialize the first data buffering unit 340, the sensing node SO is precharged to a voltage corresponding to the power supply voltage VCC. Then, when the set signal FSET of the first data buffering unit 340 is activated, the node 'QF_N' of the first data buffering unit 340 is initialized to logic 'low'. Then, when the transfer control signal CTR of the second data buffering unit 350 is activated, the sensing node SO has a logic level corresponding to data stored in the node 'QC_N' of the second data buffering unit 350. When the node 'QC_N' of the second data buffering unit 350 stores data having a value of logic 'high' (1), the sensing node SO has a value of logic 'high' (1) corresponding to the data of the node 'QC_N' of the second data buffering unit 350, and when the node 'QC_N' of the second data buffering unit 350 stores data having a value of logic 'low' (0), the sensing node SO has a value of logic 'low' (0) corresponding to the data of the node 'QC_N' of the second data buffering unit 350. In other words, the data value of the node 'QC_N' of the second data buffering unit 350 is transferred to the sensing node SO. The logic level of the sensing node SO decides whether an activation operation of the discharging unit 330 is performed, and whether the activation operation of the discharging unit 330 is performed decides a logic level of the common node CON.

Then, when the reset signal FRST of the first data buffering unit 340 is activated, the logic value values of the nodes 'QF' and 'QF_N' of the first data buffering unit 340 are decided. When the sensing node SO has a value of logic 'high' (1), the node 'QF_N' of the first data buffering unit 340 stores data having a value of logic 'high' (1), and when the sensing node SO has a value of logic 'low' (0), the node 'QF_N' of the first data buffering unit 340 stores data having a value of logic 'low' (0). When considering the fact that the sensing node SO has a value corresponding to the node 'QC_N' of the second data buffering unit 350, it can be understood that the data of the node 'QC_N' of the second data buffering unit 350 has been duplicated to the node 'QF_N' of the first data buffering unit 340.

As a consequence, the data duplication operation may be divided into an operation ① for initializing the nodes 'QF' and 'QF_N' of the first data buffering unit 340, an operation ② for transferring the data stored in the second data buffering unit 350, and an operation ③ for storing the transferred data in the first data buffering unit 340. Thus, the first data buffering unit 340 may duplicate the data stored in the second data buffering unit 350.

The first and second data buffering units 340 and 350 have the same data through such a data duplication operation.

Such a data duplication operation is also applicable to the third and fourth data buffering units 360 and 370. That is, the data stored in the node 'QC_N' of the second data buffering unit 350 may be duplicated to the node 'QF_N' of the first data buffering unit 340 as described above, may be duplicated to a node 'QM_N' of the third data buffering unit 360 and a node 'QT_N' of the fourth data buffering unit 370. That is, the first to fourth data buffering units 340, 350, 360, and 370 may store the same data through the data duplication operation.

Figure 5:
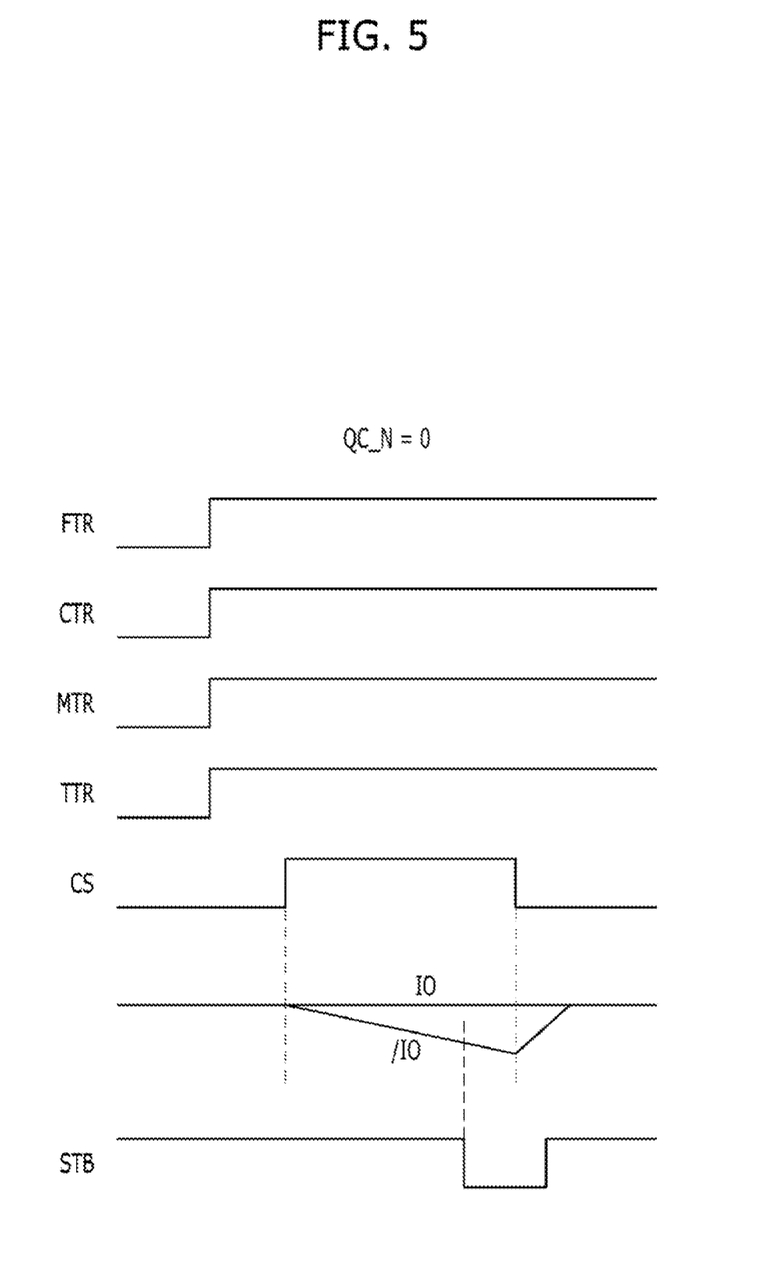
FIG. 5 is a timing diagram for explaining an output operation of the page buffering block shown in FIG. 3.

FIG. 5 is a timing diagram for explaining the output operation of the page buffering block 220 shown in FIG. 3. For the purpose of convenience, an example in which the node 'QC_N' of the second data buffering unit 350 stores data having a value of logic 'low' (0) will be described.

Referring to FIGS. 3 to 5, the data output operation is included in the data read operation, and represents an operation after the data duplication operation described in FIG. 4. First, respective transfer control signals FTR, CTR, MTR, and TTR of the first to fourth data buffering units 340, 350, 360, and 370 are activated, the latching section 342 of the first data buffering unit 340 and the latching sections 362 and 372 of the third and fourth data buffering units 360 and 370 are coupled to the node 'QC_N' of the second data buffering unit 350. Then, when the input/output control signal CS is activated, the node 'QC' of the second data buffering unit 350 is coupled to the input/output line IO and the node 'QC_N' is coupled to the complementary input/output line /IO. In the data output operation, current paths are formed between the first to fourth data buffering units 340, 350, 360, and 370 and the data input/output unit 380, which will be described in more detail in FIG. 6. As a consequence, the driving ability of the first to fourth data buffering units 340, 350, 360, and 370 are reflected in the complementary input/output line /IO coupled to the node 'QC_N' of the second data buffering unit 350. Then, data outputted through the input/output line IO and the complementary input/output line /IO is finally outputted to the exterior in response to a data strobe signal STB.

Figure 6:
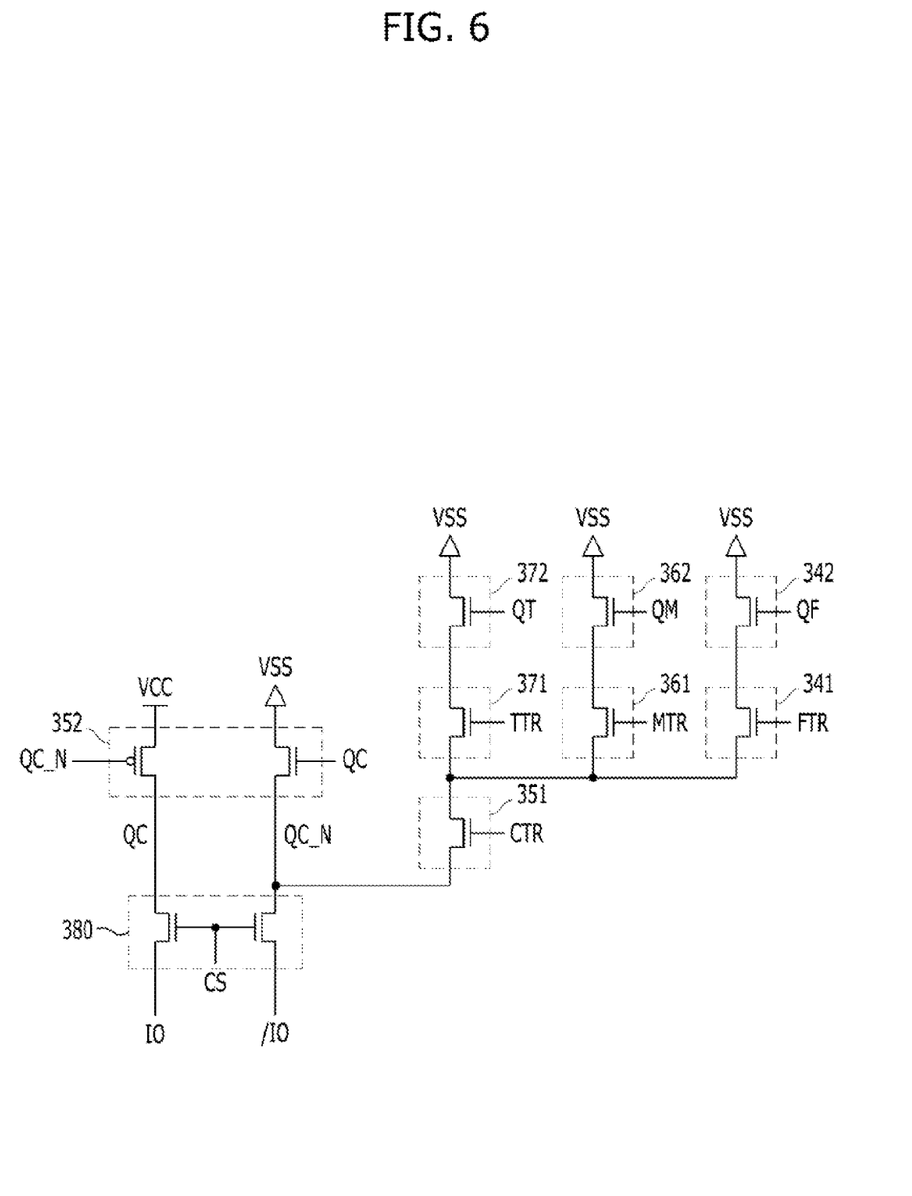
FIG. 6 is a diagram for explaining the output operation shown in FIG. 5.

FIG. 6 is a circuit diagram for explaining the output operation shown in FIG. 5. For the purpose of convenience, the reference numerals illustrated in FIG. 3 are used in FIG. 6 as is, and FIG. 6 illustrates only a circuit in which a current circuit is formed in the data output operation. The timing diagram of FIG. 5 illustrates when the node 'QC_N' of the second data buffering unit 350 stores data having a value of logic 'low' (0). That is, the node 'QF_N' of the first data buffering unit 340, the node 'QM_N' of the third data buffering unit 360, and the node 'QT_N' of the fourth data buffering unit 370 store data having a value of logic 'low' (0) through the data duplication operation, and the nodes 'QF', 'QC', 'QM', and 'QT' corresponding to the respective nodes store data having a value of logic 'high' (1).

Referring to FIGS. 3, 5 and 6, the respective latching sections 342, 352, 362, and 372 of the first to fourth data buffering units 340, 350, 360, and 370 are turned on according to the data of the nodes 'QF', 'QC_N' and 'QC', 'QM', and 'QT'. When the respective transfer control signals FTR, CTR, MTR, and TTR of the first to fourth data buffering units 340, 350, 360, and 370 are activated, the respective data transfer sections 341, 351, 361, and 371 of the first to fourth data buffering units 340, 350, 360, and 370 are also turned on. Accordingly, current paths corresponding to the first to fourth data buffering units 340, 350, 360, and 370 are formed between the node 'QC_N' and the ground voltage VSS terminal. The fact that a plurality of current paths are formed to the node 'QC_N' represents that the complementary input/output line /IO with relatively large driving ability after the input/output control signal CS is activated.

In accordance with this embodiment of the present invention, the semiconductor memory device may adjust driving ability in the data output operation by using the first to fourth data buffering units 340, 350, 360, and 370 provided in the page buffering block 220.

In FIG. 6, the current paths are formed using the respective transfer control signals FTR, CTR, MTR, and TTR of the first to fourth data buffering units 340, 350, 360, and 370 in the data output operation, but the current paths may also be formed using the respective set signals FSET, CSET, MSET, and TSET of the first to fourth data buffering units 340, 350, 360, and 370. Furthermore, in FIG. 6, since the input/output line IO and the complementary input/output line /IO are precharged to a positive voltage, a current path is formed to discharge a corresponding input/output line of the input/output line IO and the complementary input/output line /IO in the data output operation. However, when the input/output line IO and the complementary input/output line /IO are precharged to a negative voltage, a current path is formed to charge a corresponding input/output line of the input/output line IO and the complementary input/output line /IO in the data output operation.

Figure 7:
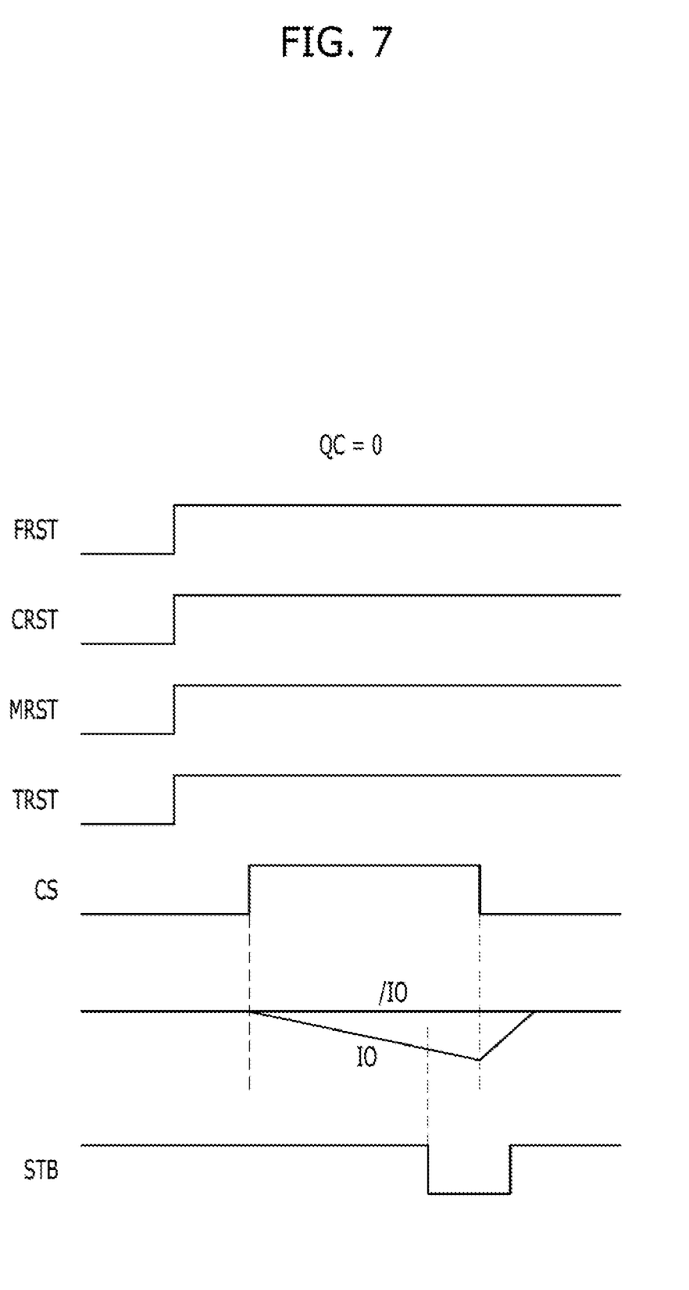
FIG. 7 is a timing diagram for explaining the output operation of a page buffering block shown in FIG. 3.

FIG. 7 is a timing diagram for explaining the output operation of the page buffering block 220 shown in FIG. 3. For the purpose of convenience, an example in which the node 'QC' of the second data buffering unit 350 stores data having a value of logic 'low' (0) will be described.

Referring to FIGS. 3, 4, and 7, when the respective reset signals FRST, CRST, MRST, and TRST of the first to fourth data buffering units 340, 350, 360, and 370 are activated, the latching section 342 of the first data buffering unit 340 and the latching sections 362 and 372 of the third and fourth data buffering units 360 and 370 are coupled to the node 'QC' of the second data buffering unit 350. Then, when the input/output control signal CS is activated, the node 'QC' of the second data buffering unit 350 is coupled to the input/output line IO and the node 'QC_N' is coupled to the complementary input/output line /IO. In the data output operation, current paths are formed between the first to fourth data buffering units 340, 350, 360, and 370 and the data input/output unit 380. As a consequence, the driving ability of the first to fourth data buffering units 340, 350, 360, and 370 are reflected in the input/output line IO coupled to the node 'QC' of the second data buffering unit 350. Then, data outputted through the input/output line IO and the complementary input/output line /IO is finally outputted to an exterior (e.g. an external device or host) in response to the data strobe signal STB.

Figure 8:
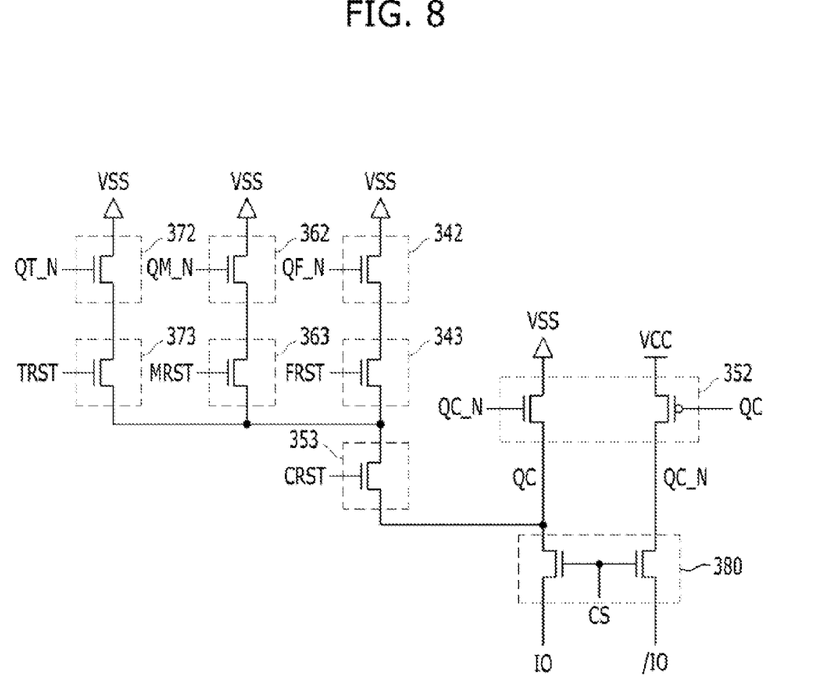
FIG. 8 is a circuit diagram for explaining an output operation shown in FIG. 7.

FIG. 8 is a circuit diagram for explaining the output operation shown in FIG. 7. For the purpose of convenience, the reference numerals illustrated in FIG. 3 are used in FIG. 8 as is, and FIG. 8 illustrates only a circuit in which a current circuit is formed in the data output operation. The timing diagram of FIG. 7 illustrates when the node 'QC' of the second data buffering unit 350 stores data having a value of logic 'low' (0). That is, the node 'QF' of the first data buffering unit 340, the node 'QM' of the third data buffering unit 360, and the node 'QT' of the fourth data buffering unit 370 store data having a value of logic 'low' (0) through the data duplication operation, and the nodes 'QF_N', 'QC_N', 'QM_N', and 'QT_N' corresponding to the respective nodes store data having a value of logic 'high' (1).

Referring to FIGS. 3, 7 and 8, the respective latching sections 342, 352, 362, and 372 of the first to fourth data buffering units 340, 350, 360, and 370 are turned on according to the data of the nodes 'QF_N', 'QC' and 'QC_N', 'QM_N', and 'QT_N'. When the respective reset signals FRST, CRST, MRST, and TRST of the first to fourth data buffering units 340, 350, 360, and 370 are activated, corresponding transistors of the respective set/reset sections 343, 353, 363, and of the first to fourth data buffering units 340, 350, 360, and 370 are also turned on. Accordingly, current paths corresponding to the first to fourth data buffering units 340, 350, 360, and 370 are formed between the node 'QC' and the ground voltage VSS terminal. The fact that a plurality of current paths are formed to the node 'QC' represents that the input/output line IO may be driven with relatively large driving ability after the input/output control signal CS is activated.

In accordance with the embodiment of the present invention, the semiconductor memory device may adjust driving ability in the data output operation by using the first to fourth data buffering units 340, 350, 360, and 370 provided in the page buffering block 220.

Figure 9:
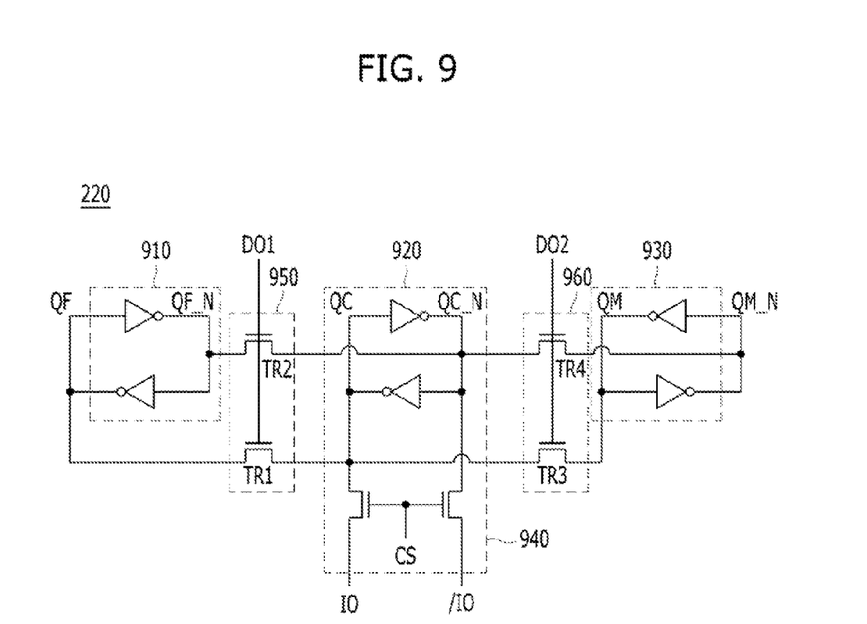
FIG. 9 is a detailed diagram of a page buffering block shown in FIG. 2.

FIG. 9 is a detailed diagram of the page buffering block 220 shown in FIG. 2. For the purpose of convenience, only some circuits of the embodiment of FIG. 3 and a few added circuits will be described.

Referring to FIG. 9, the page buffering block 220 includes first to third latching units 910, 920, and 930, a data input/output unit 940, and first and second transfer units 950 and 960. The first to third latching units 910, 920, and 930 correspond to the first to third latching sections 342, 352, and 362 of FIG. 3, the data input/output unit 940 corresponds to the data input/output unit 380 of FIG. 3, and the first and second transfer units 950 and 960 are added. Other circuits of FIG. 3, other than the aforementioned configuration, will not be illustrated in the drawing and the following description will be given.

The first transfer unit 950 includes a first transistor TR1 for coupling the first latching unit 910 to the second latching unit 920 in response to a first control signal DO1 activated in the data output operation, that is, for coupling a node 'QF' of the first latching unit to a node 'QC' of the second latching unit 920 in response to the first control signal DO1, and a second transistor TR2 for coupling a node 'QF_N' of the first latching unit 910 to a node 'QC_N' of the second latching unit 920 in response to the first control signal DO1.

The second transfer unit 960 includes a third transistor TR1 for coupling the second latching unit 920 to the third latching unit 930 in response to a second control signal DO2 activated in the data output operation, that is, for coupling the node 'QC' of the second latching unit 920 to a node 'QM' of the third latching unit 930 in response to the second control signal DO2, and a fourth transistor TR4 for coupling the node 'QC_N' of the second latching unit 920 to a node 'QM_N' of the third latching unit 930 in response to the second control signal DO2.

Through the data duplication operation after the data sensing operation, the node 'QF' of the first latching unit 910, the node 'QC' of the second latching unit 920, and the node 'QM' of the third latching unit 930 have the same data, and similarly, the node 'QF_N' of the first latching unit 910, the node 'QC_N' of the second latching unit 920, and the node 'QM_N' of the third latching unit 930 also have the same data. When the first and second control signals DO1 and DO2 are activated in the data output operation, the first latching unit 910 may drive the nodes 'QC' and 'QC_N' of the second latching unit 920, and the third latching unit 930 may also drive the nodes 'QC' and 'QC_N' of the second latching unit 920. Then, when a node QC and a complementary node QC_N are coupled to an input/output line IO and a complementary input/output line /IO in response to the input/output control signal CS, data stored in the second latching unit 920 is outputted to the input/output line IO and the complementary input/output line /IO by using the driving ability of the first to third latching units 910, 920, and 930.

The driving ability of the first and third latching units 910 and 930 is reflected to the second latching unit 920, so that all the driving ability of the first to third latching units 910, 920, and 930 may be used in the data output operation.

Referring to again FIG. 3, as described above, the first to fourth data buffering units 340, 350, 360, and 370 store corresponding data in the programming operation. The data includes actual data stored in the multi-level cell, data corresponding to a programming state, and the like. That is, as the amount of data to be stored in the programming operation is increased, the number of data buffering units should be increased. For example, when four data buffering units are required as illustrated in FIG. 3 to store 2 bit data, one or more data buffering units should be increased to store 3 bit data. Furthermore, recently, programming operations have become more and more complicated, resulting in an increase in the number of data buffering units.

Figure 10:
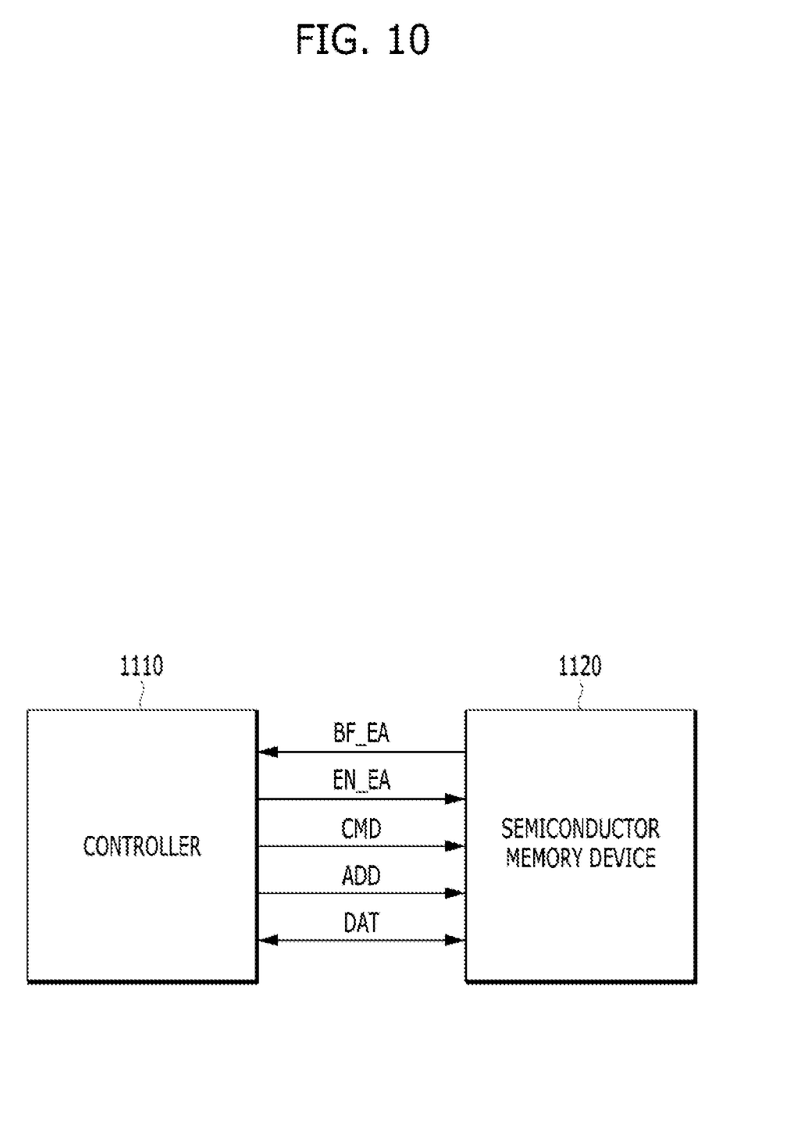
FIG. 10 is a block diagram illustrating a semiconductor memory system in accordance with an embodiment of the present invention.

FIG. 10 is a block diagram illustrating a semiconductor memory system in accordance with an embodiment of the present invention.

Referring to FIG. 10, the semiconductor memory system may include a controller 1110 and a semiconductor memory device 1120.

The controller 1110 controls the semiconductor memory device 1120, and the controller 1110 and the semiconductor memory device 1120 exchange various signals. For example, the controller 1110 may control a data write operation for storing data DAT in the semiconductor memory device 1120 and a data read operation for outputting the stored data DAT to be performed. The controller 1110 and the semiconductor memory device 1120 may exchange a command CMD, the data DAT, and an address ADD for such operations.

The semiconductor memory device 1120, for example, may have the configuration illustrated in FIG. 2 and, similarly, may include the page buffering block 220 as illustrated in FIG. 3. The semiconductor memory device 1120 provides the controller 1110 with buffer number information BF_EA and the controller 1110 provides activation number information EN_EA. The buffer number information BF_EA represents the number of data buffering units provided in the page buffering block 220. In the embodiment of FIG. 3, the number of data buffering units is four (the first to fourth data buffering units 340, 350, 360, and 370). The activation number information EN_EA represents the number of data buffering units activated in a data read operation.

Hereinafter, a circuit operation of the semiconductor memory system will be described.

The semiconductor memory device 1120 provides the controller 1110 with the buffer number information BF_EA before performing the circuit operation. As described above, data buffering units to be activated in the data output operation correspond to driving ability in the data output operation. Thus, the buffer number information BF_EA provided to the controller 1110 represents the maximum driving ability of the semiconductor memory device 1120 in the data output operation. Accordingly, the controller 1110 may calculate the maximum driving ability of the semiconductor memory device 1120 in the data output operation based on the buffer number information BF_EA. Then, the controller 1110 decides the most efficient driving ability of the semiconductor memory device 1120 based on the calculated maximum driving ability, and outputs the decided driving ability as the activation number information EN_EA. Accordingly, the semiconductor memory device 1120 may perform the data output operation by a number of data buffering units corresponding to the activation number information EN_EA.

The controller 1110 may recognize the number of data buffering units provided in the semiconductor memory device 1120, and adjust the driving ability of the semiconductor memory device 1120 in the data output operation by adjusting the number of the data buffering units. This shows that it may be possible to adjust the speed of the data output operation of the semiconductor memory device 1120.

A method for adjusting the number of the data buffering units to be activated may be changed according to the design purpose.

For example, it may be possible to directly control the activation operations of the first to fourth data buffering units 340, 350, 360, and 370 by using the activation number information EN_EA provided by the controller 1110.

For example, in the embodiment of FIG. 3, it may be possible to adjust the number of the first to fourth data buffering units 340, 350, 360, and 370 to be activated by controlling the activation operations of the respective transfer control signals FTR, CTR, MTR, and TTR, the respective set signals FSET, CSET, MSET, and TSET, or the respective reset signals FRST, CRST, MRST, and TRST of the first to fourth data buffering units 340, 350, 360, and 370. The transfer control signals FTR, CTR, MTR, and TTR, the set signals FSET, CSET, MSET, and TSET, or the reset signals FRST, CRST, MRST, and TRST may be controlled by the control block 260 of FIG. 2.

For example, in the case of the embodiment of FIG. 9, the driving ability of the first and second transfer units 950 and 960 may be reflected to the second latching unit 920, so that it may be possible to adjust the number of data buffering units to be activated. Furthermore, the first and second driving ability transfer units 950 and 960 may also be controlled by the control block 260 of FIG. 2.

As described above, in the semiconductor memory device in accordance with the embodiment of the present invention, a plurality of data buffering units in the programming operation are also available in the data read operation. Furthermore, driving ability is increased using the data buffering units in the data read operation, so that the speed of a data output operation may be increased. Moreover, the controller recognizes the number of data buffering units of the semiconductor memory device and controls the number of data buffering units to be activated in the data output operation, so that the speed of the output operation of the semiconductor memory device may be adjusted.

Although various embodiments have been described for illustrative purposes, it will be apparent to those skilled in the art that various changes and modifications may be made without departing from the spirit and scope of the invention as defined in the following claims. For example, the positions and types of logic gates and transistors in the aforementioned embodiments could be realized differently depending on the polarity of the inputted signals.

What is claimed is:

1. A semiconductor memory device comprising:
   a plurality of data buffering units corresponding to a data line, wherein the data buffering units include a first data buffering unit suitable for latching data stored in a memory cell in a data read operation, and at least one of second data buffering units;
   an output unit suitable for outputting the data latched in the first data buffering unit;
   a control block suitable for controlling a current path to be formed between the second data buffering units and the output unit in the data read operation; and
   a plurality of transfer units suitable for coupling the first data buffering unit and the at least one of the second data buffering units to transfer a driving ability of the second data buffering units to the first data buffering unit.

2. The semiconductor memory device of claim 1, wherein each of the second data buffering units comprises:
   a latching section suitable for latching data;
   a data transfer section coupled between a sensing node and the latching section; and
   a set/reset section coupled between the latching section and a common node.

3. The semiconductor memory device of claim 2, wherein the data transfer section transfers data, transferred to the sensing node, to the latching section in a data duplication operation.

4. The semiconductor memory device of claim 2, wherein the set/reset section included in each of the second data buffering units initializes the latching section at a beginning of a data duplication operation.

5. The semiconductor memory device of claim 2, wherein the control block controls the data transfer section or the set/reset section, which is included in each of the second data buffering units, based on the data stored in the first data buffering unit in the data read operation.

6. The semiconductor memory device of claim 1, wherein each of the first data buffering unit and the second data buffering units comprises:
   a latching section suitable for latching data; and
   a transfer section coupled between the latching section of the first data buffering unit and the latching sections of the second data buffering units.

7. The semiconductor memory device of claim 1, wherein each of the second data buffering units is coupled to the first data buffering unit through a corresponding transfer section.

8. The semiconductor memory device of claim 7, wherein, in the data read operation, the control block selectively activates the transfer sections of the second data buffering units.

9. The semiconductor memory device of claim 1, wherein, in a programming operation, data is stored in the second data buffering units.

10. A method for operating a semiconductor memory device, comprising:
sensing data stored in a memory cell and latching the sensed data in a first data buffering unit;
duplicating the data latched in the first data buffering unit to second data buffering units, wherein the first data buffering unit and second data buffering units store the same data through the data duplication operation; and
outputting the data latched in the first data buffering unit and the same data latched in at least one data buffering unit of the second data buffering units at the same time through one data pair line, to use all driving ability of the first data buffering unit and the second data buffering units in a data read operation.

11. The method of claim 10, wherein the duplicating comprises:
initializing the at least one data buffering unit of the second data buffering units;
transferring the data latched in the first data buffering unit to a predetermined node; and
latching the data transferred to the predetermined node in the at least one data buffering unit of the second data buffering units.

12. The method of claim 10, wherein, in the outputting of the data, the first data buffering unit and the at least one data buffering unit of the second data buffering units have duplicate data.

13. The method of claim 12, wherein, in the outputting of the data, a current path is formed between an output terminal and the first data buffering unit and the at least one data buffering unit of the second data buffering units.

14. The method of claim 10, further comprising:
latching data in the second data buffering units in a programming operation.

15. A semiconductor memory system comprising:
a semiconductor memory device including a plurality of data buffering units; and
a controller suitable for receiving information on the number of the data buffering units, and generating activation information corresponding to the number of data buffering units to be activated in a data read operation of the semiconductor memory device,
wherein the data buffering units comprises:
a first data buffering unit suitable for latching data stored in a memory cell in a data read operation, and at least one second data buffering units suitable for latching the same data as the first data buffering unit; and
a plurality of transfer units suitable for coupling the first data buffering unit and the at least one of the second data buffering units to transfer a driving ability of the second data buffering units to the first data buffering unit.

16. The semiconductor memory system of claim 15, wherein the second data buffering units latching data in a programming operation are selectively activated based on the activation information.

17. The semiconductor memory system of claim 16, wherein each of the second data buffering units comprises:
a latching section suitable for latching data;
a data transfer section coupled between a sensing node and the latching section; and
a set/reset section coupled between the latching section and a common node.

18. The semiconductor memory system of claim 17, wherein, in the data read operation, the data transfer section and the set/reset section included in each of the second data buffering units are controlled based on the data latched in the first data buffering unit and the activation information.

19. The semiconductor memory system of claim 16, wherein each of the second data buffering units is coupled to the first data buffering unit through a corresponding transfer section.

20. The semiconductor memory system of claim 19, wherein, in the data read operation, the transfer sections of the second data buffering units are selectively activated based on the activation information.

* * * * *